US012135529B2

(12) United States Patent
Hong et al.

(10) Patent No.: US 12,135,529 B2
(45) Date of Patent: Nov. 5, 2024

(54) POST PREVENTATIVE MAINTENANCE CHAMBER CONDITION MONITORING AND SIMULATION

(71) Applicant: Applied Materials, Inc., Santa Clara, CA (US)

(72) Inventors: Jeong Jin Hong, Yongin (KR); Mihyun Jang, Seoul (KR)

(73) Assignee: Applied Materials, Inc., Santa Clara, CA (US)

(*) Notice: Subject to any disclaimer, the term of this patent is extended or adjusted under 35 U.S.C. 154(b) by 300 days.

(21) Appl. No.: 17/551,180

(22) Filed: Dec. 14, 2021

(65) Prior Publication Data

US 2023/0185255 A1 Jun. 15, 2023

(51) Int. Cl.
G05B 13/04 (2006.01)
G05B 13/02 (2006.01)
(Continued)

(52) U.S. Cl.
CPC ....... *G05B 13/048* (2013.01); *G05B 13/0265* (2013.01); *G06F 18/214* (2023.01); *G06N 5/01* (2023.01); *H01L 21/67207* (2013.01)

(58) Field of Classification Search
None
See application file for complete search history.

(56) References Cited

U.S. PATENT DOCUMENTS 6,656,848 B1 12/2003 Scanlan et al.
6,839,603 B2 * 1/2005 Karasawa ........ G05B 19/41865
700/101

(Continued)

FOREIGN PATENT DOCUMENTS

KR 1020110129742 A 12/2011
KR 20190060547 A 6/2019
(Continued)

OTHER PUBLICATIONS

Amarbayasgalan, T. et al., "Unsupervised Anomaly Detection Approach for Time-Series in Multi-Domains Using Deep Reconstruction Error", https://doi.org/10.3390/sym12081251, Symmetry 12, No. 8: 1251, published Jul. 29, 2020, 22 pages.
(Continued)

*Primary Examiner* — David Earl Ogg
(74) *Attorney, Agent, or Firm* — Lowenstein Sandler LLP

(57) ABSTRACT

The subject matter of this specification can be implemented in, among other things, methods, systems, computer-readable storage medium. A method can include a processing device receiving sensor data indicating a state of an environment of a processing chamber processing a series of substrates according to a substrate processing procedure. The series of substrates may be processed subsequent to a preventive maintenance procedure. The processing device may determine a first set of values based on the sensor data. The set of values may indicate a likelihood an associated substrate comprises a first process result that meets a threshold condition of the substrate processing procedure. The processing device may further predict a first test result based on the first set of values. The first test result may indicate a likelihood a first substrate processed subsequent to processing the series of substrates comprises a second process result that meets the threshold condition.

20 Claims, 8 Drawing Sheets

(51) Int. Cl.
*G06F 18/214* (2023.01)
*G06N 5/01* (2023.01)
*H01L 21/67* (2006.01)

(56) References Cited

U.S. PATENT DOCUMENTS

| | | | |
|---|---|---|---|
| 10,254,641 | B2 | 9/2019 | Mailfert et al. |
| 10,705,514 | B2 | 7/2020 | Banna |
| 2007/0288409 | A1 | 12/2007 | Mukherjee et al. |
| 2010/0042452 | A1 | 2/2010 | Chen et al. |
| 2010/0332201 | A1* | 12/2010 | Albarede .......... H01J 37/32935 703/2 |
| 2012/0179373 | A1 | 7/2012 | Lee et al. |
| 2016/0313651 | A1 | 10/2016 | Middlebrooks et al. |
| 2017/0062227 | A1 | 3/2017 | Ishikawa et al. |
| 2018/0040460 | A1* | 2/2018 | Gottscho .......... H01J 37/32935 |
| 2019/0294980 | A1 | 9/2019 | Laukien et al. |
| 2020/0243359 | A1* | 7/2020 | Hao .................. H01J 37/32889 |
| 2020/0324410 | A1* | 10/2020 | Bergantz ................ B25J 9/1664 |
| 2022/0005713 | A1 | 1/2022 | Lu et al. |

FOREIGN PATENT DOCUMENTS

| | | |
|---|---|---|
| WO | 2018204410 A1 | 11/2018 |
| WO | 2022103720 A1 | 5/2022 |

OTHER PUBLICATIONS

Reiß, M. et al., "Nonasymptotic upper bounds for the reconstruction error of PCA", https://arxiv.org/abs/1609.03779, Cornell University, Mar. 29, 2019, 44 pages.

Deng, A. et al., "Graph Neural Network-Based Anomaly Detection in Multivariate Time Series", Proceedings of the AAAI Conference on Artificial Intelligence, https://doi.org/10.1609/aaai.v3515.16523, vol. 35 No. 5: AAAI-21 Technical Tracks 5, pp. 4027-4035.

Zhang, C. et al., "A Deep Neural Network for Unsupervised Anomaly Detection and Diagnosis in Multivariate Time Series Data", Proceedings of the AAAI Conference on Artificial Intelligence, https://doi.org/10.1609/aaai.v33i01.33011409 vol. 33 No. 01: AAAI-19, IAAI-19, EAAI-20, Jul. 17, 2019, pp. 1409-1416.

International Search Report and Written Opinion of International Application No. PCT/US2022/052176 mailed Mar. 27, 2023.

Shiga, M., et al., "Seasoning Optimization by Using Optical Emission Spectroscopy," 2020 International Symposium on Semiconductor Manufacturing, Dec. 15-16, 2020, 3 pages.

Agarwal, A. et al., "Seasoning of plasma etching reactors: Ion energy distributions to walls and real-time and run-to-run control strategies," Journal of Vacuum Science & Technology A, published Apr. 25, 2008, pp. 498-512, vol. 26, No. 3.

International Search Report and Written Opinion for International Application No. PCT/US2023/010347, mailed May 3, 2023, 10 Pages.

\* cited by examiner

POST PREVENTATIVE MAINTENANCE CHAMBER CONDITION MONITORING AND SIMULATION

TECHNICAL FIELD

The instant specification generally relates to chamber condition monitoring and simulation. More specifically, the instant specification relates to monitoring and simulating chamber conditions associated with a chamber seasoning.

BACKGROUND

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate processes, conditions of processing chambers may be altered and may result processed substrate failing to meet desired conditions and outcomes.

One such substrate process may include plasma etching, which is a process of transferring a pattern in a layer of mask material into another layer under the mask, such as a layer of conductive or dielectric material, by removing the layered material from the wafer surface. Such process inevitably generates different kinds of etch by-products, such as silicon oxide and organic polymer, depending on the layered material and the etch chemistry. Some of the by-products deposit onto interior surfaces of the chamber in which the plasma etching process is performed. The deposition of the by-products may affect etch performance such as by depositing particles (e.g., flakes) onto the substrate or by reacting with the plasma and affecting the process result.

To mitigate the impact of etch by-products, preventative maintenance such as chamber cleaning may be employed to periodically remove the deposition from the chamber wall. To do this, the chamber is taken out of production, and a cleaning plasma, such as a $CF_4+O_2$ plasma for cleaning silicon oxide deposited during silicon etching, is introduced into the chamber. This plasma reacts with the deposition and the products of this reaction are pumped out of the chamber. After such chamber cleaning, however, it has been observed that a clean chamber wall makes the chamber unsuitable for immediate production wafer etching. Chamber seasoning is a procedure of etching a series of substrate (e.g., blank silicon wafers) to restore a chamber condition that is suitable for production substrate process. After chamber seasoning, a thin layer of silicon oxide covers the chamber wall. The chamber is then returned to production wafer etching until the next round of chamber cleaning and seasoning becomes necessary.

SUMMARY

A method and system for post preventative maintenance monitoring and simulation is performed. In some embodiments, a method, performed by a processing device, may include receiving sensor data indicating a state of an environment of a processing chamber processing a series of substrates according to a chamber seasoning procedure. The series of substrate are processed subsequent to a preventive maintenance procedure performed on the processing chamber. The processing device may determine a first set of values based on the sensor data. The first set of values may each be associated with individual substrates of the series of substrates. The first set of values may indicate a likelihood an associated substrate comprises a first process result that meets a threshold condition of the substrate processing procedure. The processing device may predict a first test result based on the first set of values. The first test result may indicate a likelihood a first substrate processed subsequent to processing the series of substrates comprises a second process results that meets the threshold condition. The processing device may prepare the first test result for presentation on a graphical user interface (GUI). The processing device may alter an operation of the processing chamber based on the first test result.

In some embodiments, a method for training a machine learning model to predict a condition of a processing chamber subsequent to a preventative maintenance procedure. The method includes generating training data for the machine learning model. Generating the training data may include identifying a first training input having first sensor data. The first sensor data indicating a first state of a first processing chamber subsequent to performing the preventative maintenance procedure. Generating the training data may further include identifying a first target output for the first training input. The first target output may indicate whether a substrate processed by the first processing chamber in the first state according to a first substrate processing procedures results in the first substrate having a first process result that meets a first threshold condition associated with the first substrate processing procedure. The method may further include providing the training data to train the machine learning model on (i) a set of training inputs comprising the first training input; and (ii) a set of target outputs comprising the first target output. The trained machine learning model may receive a new input having new sensor data indicative of a new state of a new processing chamber. The new output may indicate whether a new substrate processed by the new processing chamber in the new state according to the first substrate processing procedure results in the new substrate having a new process result that meets the threshold condition.

In some embodiments, the above described methods may be stored on a non-transitory machine-readable storage medium comprising instructions that, when executed by a processing device, cause the processing device to perform operations that may include one or more steps described in the preceding methods.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
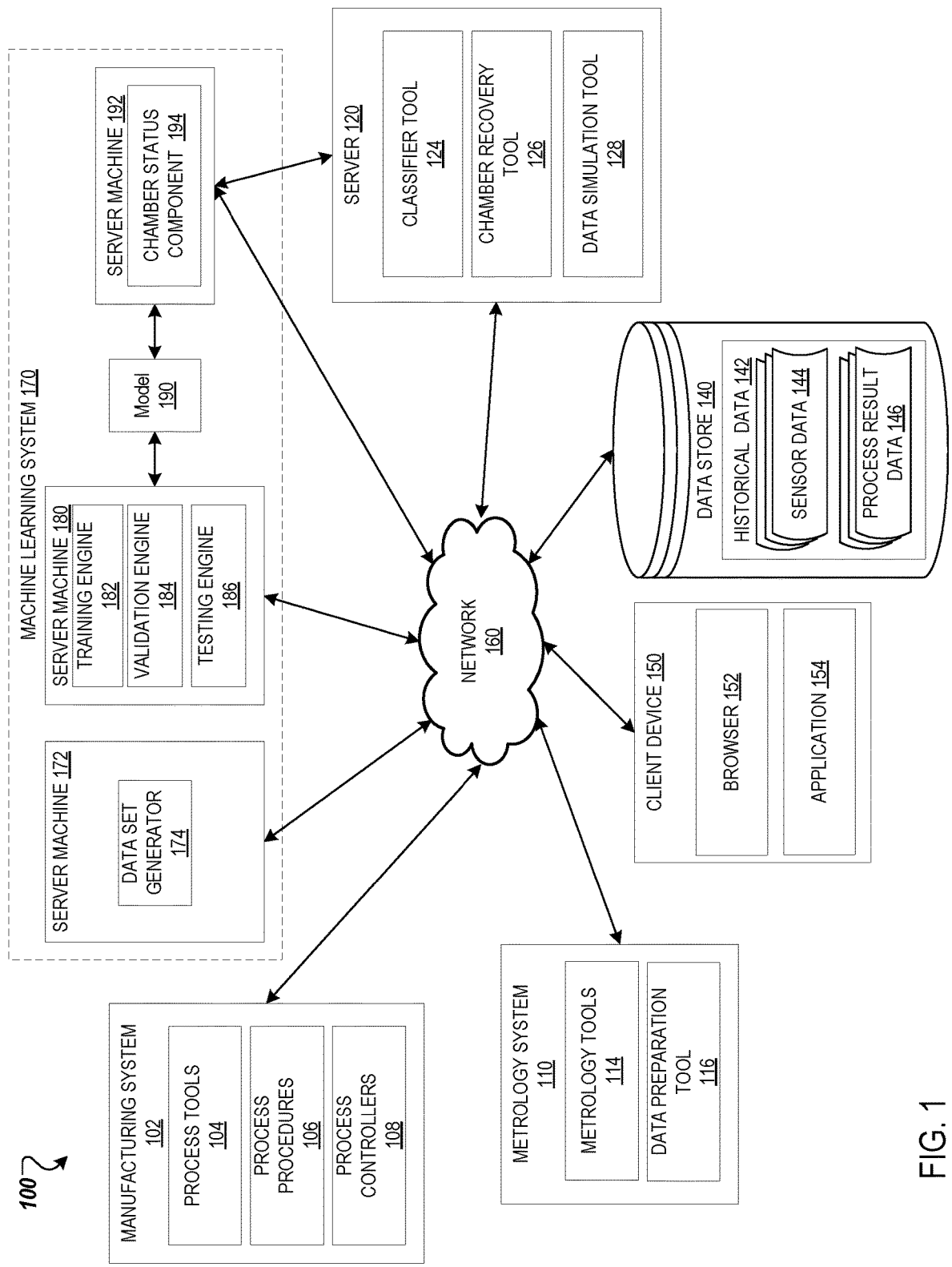
FIG. 1 is a block diagram illustrating an exemplary system architecture in which implementations of the disclosure may operate.

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate procedures, conditions of processing chambers may depreciate and result in processed substrates failing to meet desired conditions or process results (e.g., critical dimensions, process uniformity, thickness dimensions, etc.).

Preventative maintenance procedures (e.g., chamber cleaning) are often used as part of a chamber recovery process to return a state of the processing chamber into a state suitable for entering a substrate processing production mode (e.g., mass processing of substrates). A recovery procedure is often used subsequent to a preventative maintenance procedure to prepare a chamber for the production mode (e.g., "warm up" the chamber). A common recovery procedure conventionally employed is seasoning a processing chamber. Chamber seasoning is a procedure that includes processing a series of substrates (e.g., blank silicon wafers) to restore a chamber condition (e.g., coating the walls of the chamber) that is suitable for a production substrate process (e.g., substrates processed in the chamber having process results that meet desired threshold criteria). After chamber seasoning, a chamber may operate in a production mode for a period of time until another round of preventative maintenance and further chamber seasoning is needed or otherwise recommended to restore a state of the processing chamber.

As previously mentioned, chamber seasoning procedures include processing a series of substrates to prepare a chamber for performing a substrate processing procedure. The substrate processing procedure may include a set conditions of the chamber (e.g., temperature, pressure, vacuum conditions, plasma conditions, etc.) to obtain substrates with target process results (e.g., process results meeting threshold criteria associated with substrate process recipes).

Conventionally, a series of substrates are processed within a processing chamber subsequent to a preventative maintenance procedure. Subsequent to processing the series of substrates a test sample is processed and evaluated. A test sample may include a substrate that is processed in the processing chamber and is evaluated (e.g., process results are measured) to determine whether the test sample contains process results meeting threshold conditions. If the condition(s) are not met further seasoning substrate may be processed and another test sample may be processed to determine whether a chamber is fully recovered. This process may be repeated until a chamber condition is met or a threshold quantity of seasoning wavers have been used. Conventional methods of determining chamber conditions, such as previously described, can require unnecessary quantities of seasoning wafers (e.g., "over-seasoning" a chamber) when a first quantity of seasoning wafer are used but a smaller number is actually required to recover a chamber into an operable state to carry out a substrate production. Additionally, conventional methods can necessitate delays in returning a chamber to a production mode by waiting for test sample measurements and evaluations needed to determine whether a chamber has sufficiently recovered. The time taking for the recovery procedures is a loss in productivity because a tool or chamber is down (e.g., not operating in a production mode). Furthermore, conventional methods do not provide for in-situ chamber condition monitoring but depend on test sample and awaiting test sample evaluations during a seasoning process.

Aspects and implementation of the present disclosure address these and other shortcomings of the existing technology by providing methods and systems in various embodiments capable of estimating chamber conditions without depending on inspection results of test samples, providing quantitative information regarding chamber health and recovery subsequent to a preventive maintenance procedure, and enable simulation of chamber conditions with artificial parameter adjustments. In some embodiments, a machine learning model may be leveraged to determine chamber conditions and/or status during and/or after a seasoning procedure. In some embodiments, the present disclosure enables health check and precaution during a chamber seasoning sequence and early detection of abnormal chamber conditions before a sample test. One of more of these aspects and/or implementations may result in reduced down time of processing tools (e.g., processing chambers) and can enable greater productivity of the manufacturing equipment.

In an exemplary embodiments, a method and system for post preventative maintenance monitoring and simulation is performed. In some embodiments, a method, performed by a processing device, may include receiving sensor data indicating a state of an environment of a processing chamber processing a series of substrates according to a chamber seasoning procedure. The series of substrate are processed subsequent to a preventive maintenance procedure performed on the processing chamber. The processing device may determine a first set of values based on the sensor data. The first set of values may each be associated with individual substrates of the series of substrates. The first set of values may indicate a likelihood an associated substrate comprises a first process result that meets a threshold condition of the substrate processing procedure. The processing device may predict a first test result based on the first set of values. The first test result may indicate a likelihood a first substrate processed subsequent to processing the series of substrates comprises a second process result that meets the threshold condition. The processing device may prepare the first test result for presentation on a graphical user interface (GUI). The processing device may alter an operation of the processing chamber based on the first test result.

In an exemplary embodiment, a method for training a machine learning model to predict a condition of a processing chamber subsequent to a preventative maintenance procedure. The method includes generating training data for the machine learning model. Generating the training data may include identifying a first training input having first sensor data. The first sensor data may indicate a first state of a first processing chamber subsequent to performing the preventative maintenance procedure. Generating the training data may further include identifying a first target output for the first training input. The first target output may indicate whether a substrate processed by the first processing chamber in the first state according to a first substrate processing procedures results in the first substrate having a first process result that meets a first threshold condition associated with the first substrate processing procedure. The method may further include providing the training data to train the machine learning model on (i) a set of training inputs comprising the first training input; and (ii) a set of target outputs comprising the first target output. The trained machine learning model may receive a new input having new sensor data indicative of a new state of a new processing chamber. The new output may indicate whether a new substrate processed by the new processing chamber in the new state according to the first substrate processing procedure results in the new substrate having a new process result that meets the threshold condition.

In some embodiments, the above described methods may be stored on a non-transitory machine-readable storage medium comprising instructions that, when executed by a processing device, cause the processing device to perform operations that may include one or more operations described in the preceding methods.

FIG. 1 is a block diagram illustrating an exemplary system architecture 100 in which implementations of the disclosure may operate. As shown in FIG. 1, system architecture 100 includes a manufacturing system 102, a metrology system 110, a client device 150, a data store 140, a server 120, and a machine learning system 170. The machine learning system 170 may be part of the server 120. In some embodiments, one or more components of the machine learning system 170 may be fully or partially integrated into client device 150. The manufacturing system 102, the metrology system 110, the client device 150, the data store 140, the server 120, and the machine learning system 170 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 102, the metrology system 110, client device 150, data store 140, server 120, and machine learning system 170 may be coupled to each other via a network 160 (e.g., for performing methodology described herein). In some embodiments, network 160 is a private network that provides each element of system architecture 100 with access to each other and other privately available computing devices. Network 160 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or any combination thereof. Alternatively or additionally, any of the elements of the system architecture 100 can be integrated together or otherwise coupled without the use of network 160.

The client device 150 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 150 may include a browser 152, an application 154, and/or other tools as described and performed by other systems of the system architecture 100. In some embodiments, the client device 150 may be capable of accessing the manufacturing system 102, the metrology system 110, the data store 140, server 120, and/or machine learning system 170 and communicating (e.g., transmitting and/or receiving) indications of sensor data, processed data, data classifications, chamber recovery data (e.g., recovery profiles), process result data and/or inputs and outputs of various process tools (e.g., metrology tool 114, data preparation tool 116, classifier tool 124, chamber recovery tool 126, and/or chamber recovery component) at various stages processing of the system architecture 100, as described herein.

As shown in FIG. 1, manufacturing system 102 includes process tools 104, process procedures 106, and process controllers 108. A process controller 108 may coordinate operation of process tools 104 to perform on one or more process procedure 106. For example, various process tools may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process steps.

Process procedures 106 or sometimes referred to as process recipes or process steps may include various specifications for carrying out operations by the process tools 104. For example, a process procedure 106 may include process specifications such as duration of activation of a process operation, the process tool used for the operation, the temperature, flow, pressure, etc. of a machine (e.g., a chamber), order of deposition, and the like. In another example, process procedures may include transferring instructions for transporting a sample to a further process step or to be measured by metrology system 110. One or more process procedures 106 include preventive maintenance procedures and seasoning procedures.

Process controllers 108 can include devices designed to manage and coordinate the actions of process tools 104. In some embodiments, process controllers 108 are associated with a process recipe or series of process procedures 106 instructions that when applied in a designed manner result in a desired process result of a substrate process. For example, a process recipe may be associated with processing a substrate to produce a target process results (e.g., critical dimension, thickness, uniformity criteria, etc.) Process controllers 108 can coordinate the performance of preventative maintenance procedures (e.g., chamber cleaning) and chamber recovery procedures (e.g., chamber seasoning) to return a chamber into a production state.

As shown in FIG. 1, metrology system 110 includes metrology tools 114 and data preparation tool 116. Metrology tools 114 can include a variety of sensors to measure process results (e.g., critical dimension, thickness, uniformity, etc.) within the manufacturing system 102. For example, wafers processed within one or more processing chamber can be used to measure critical dimension. Metrology tools 114 may also include devices to measure process results of substrate processed using the manufacturing system. For example, process results such as critical dimensions, thickness measurements (e.g., film layers from etches, depositing, etc.) can be evaluated of substrates processed according to process recipe and/or action performed by process controllers 108. Those measurements can also be used to measure conditions of a chamber over a recovery process such as during a seasoning procedures that includes processing a series of wafers (e.g., blank wafers).

Data preparation tool 116 may include process methodology to extract features and/or generate synthetic/engineered data associated with data measured by metrology tools 114. In some embodiments, data preparation tool 116 can identify correlations, patterns, and/or abnormalities of metrology or process performance data. For example, data preparation tool 116 may perform a feature extraction where data preparation tool 116 uses combinations of measured data to determine whether a criterion is satisfied. For example, data preparation tool 116 can analyze multiple data points of an associated parameter (e.g., thickness, critical dimension, defectivity, plasma condition, etc.) to determine whether rapid changes occurred during an iteration of a seasoning procedure within a processing chamber. In some embodiments, data preparation tool 116 performing a normalization across the various sensor data associated with various process chamber conditions. A normalization may include processing the incoming sensor data to appear similar across the various chambers and sensors used to acquire the data.

In some embodiments, data preparation tool 116 can perform one or more of a process control analysis, univariate limit violation analysis, or a multivariate limit violation analysis on metrology data (e.g., obtained by metrology tools 114). For example, data preparation tool 116 can perform statistical process control (SPC) by employing statistics based methodology to monitor and control process controllers 108. For example, SPC can promote efficiency and accuracy of a preventative maintenance and/or waver seasoning process (e.g., by identifying data points that fall within and/or outside control limits).

In some embodiments, a processing chamber can be measured throughout a seasoning procedure. In some embodiments, increased amounts of metrology data is taken during predetermined seasoning procedures. For example, during or immediately after a wafer is processed, additional sensors can be activated and/or currently activated sensor may take additional data. In some embodiments, process controllers 108 may trigger measurement by metrology tools 114 based on operations to be performed by process tools 104. For example, process controllers 108 can trigger activation of one or more process results (e.g. of metrology tools 114) responsive to one or more testing wafers seasoning wafer being processed in during a transition period where a processing chamber completes its seasoning procedure and is awaiting an upcoming production wafer to be processed if process results meet the criteria within process procedures 106.

In some embodiments, the extracted features, generated synthetic/engineered data, and statistical analysis can be used in association with machine learning system 170 (e.g., to train, validate, and/or test machine learning model 190). Additionally and/or alternatively, data preparation tool 116 can output data to server 120 to be used by any of classifier tool 124 and/or chamber recovery tool 126.

Data store 140 may be a memory (e.g., random access memory), a drive (e.g., a hard drive, a flash drive), a database system, or another type of component or device capable of storing data. Data store 140 may store one or more historical data 142 including old sensor data 144 and/or old process result data 146 of prior chamber conditions and process results of substrates processed in the associated chamber conditions. In some embodiments, the historical data 142 may be used to train, validate, and/or test a machine learning model 190 of machine learning system 170 (See e.g., FIG. 6 for exemplary methodology).

Server 120 may include one or more computing devices such as a rackmount server, a router computer, a server computer, a personal computer, a mainframe computer, a laptop computer, a tablet computer, a desktop computer, etc. The server 120 can include a classifier tool 124, a chamber recovery tool 126, and a data simulation tool 128.

The classifier tool 124 receives metrology data (e.g., chamber sensor data) from process tools 104 and determine a status of a chamber throughout a chamber seasoning procedure. In some embodiments, the classifier tool 124 receives raw sensor data from process tool 104, in other embodiments, raw sensor data is combined with synthetic data engineered from data preparation tool 116. The classifier tool 124 may process sensor data to determine a set of values indicating likelihoods a substrate processed under associated chamber conditions would result in a substrate having a process result meeting a threshold criteria corresponding to a process procedure 106. The classifier tool 124 can classify a state or condition of a processing chamber based on received sensor data and a machine learning model trained in the machine learning system 170. For example, a state of a processing chamber during a seasoning procedure can be processed to determine whether a chamber meets condition to transition from a chamber recovery mode to a chamber production mode. In some embodiments, the classifier tool 124 includes a machine learning model that uses process data (e.g., sensor data (e.g., by process tools 104), synthetic and/or engineered data (e.g., from process tool 104), general process parameter values corresponding to process procedures 106) and determine a set of values indicating a likelihood a chamber meets threshold conditions over the course of a seasoning procedure. As will be discussed later, the machine learning model may include a bootstrap aggregation model, a random forest tree decision tree model, or a partial least squares regression (PLS) model, among other models. The machine learning model may include ensemble modeling comprising multiple models and leveraging higher confidence models for final classification of the received data.

The chamber recovery tool 126 may receive data from classifier tool 124 and generate a chamber recovery profile associated with a recovery of a processing chamber associated with a preventative maintenance and/or a seasoning procedure. The chamber recovery tool 126 may determine a preventative maintenance index indicating changes in the likelihood a chamber meets conditions to move from a recovery mode of operation to a production mode of operation. For example, the chamber recovery tool may identify when conditions of a chamber meet threshold conditions such that substrate processed under the chamber conditions results in the substrate having process results meeting threshold conditions associated with one or more process procedures 106. In some embodiments, the chamber recovery tool 126 may use a machine learning model that receives input data from classifier tool 124 and outputs preventative maintenance index values associated with a likelihood a chamber meets threshold conditions to transition to a production mode of operation.

The data simulation tool 128 coordinates with the classifier tool 124 and the chamber recovery tool 126 to identify changes in chamber status (e.g., ready to move to a production mode, needs more seasoning, needs further preventative maintenance, etc.) based on artificially adjusting components of sensor data acquired using manufacturing system 102. The data simulation tool 128 may identify one or more sensor data parameters or combination of parameters as being more impactful in a chamber recovery process. The data simulation tool may leverage the classifier tool 124 and the chamber recovery tool 126 to identify a status of a chamber under simulated conditions. The data simulation tool 128 may identify one or more process priorities associated with a chamber recovery procedure. For example, one or more simulation models may determine one or more weights associated with various process parameters (e.g., temperature, pressure, vacuum conditions, etc.).

As previously described, some embodiments of the classifier tool 124, chamber recovery tool 126, and/or data simulation tool 128 may perform their described methodology using a machine learning model. The associated machine learning models may be generated (e.g., trained, validated, and/or tested) using machine learning system 170. The following exemplary description of machine learning system 170 will be described in the context using machine learning system 170 to generate a machine learning model 190 associated with classifier tool 124. However, it should be noted that this description is purely exemplary. Analogous processing hierarchy and methodology can be used in the generation and execution of machine learning models associated with the classifier tool 124, chamber recovery tool 126, and/or the data simulation tool 128 individually and/or in combination with each other, as will be discussed further in association with other embodiments.

The machine learning system 170 may include one or more computing devices such as a rackmount server, a router computer, a server computer, a personal computer, a mainframe computer, a laptop computer, a tablet computer, a desktop computer, etc. The machine learning system 170 may include a chamber status component 194. In some embodiments, the chamber status component 194 may use historical data 142 to determine whether a status of a processing chamber meets condition to transition to a production operational mode. In some embodiments, the chamber status component 194 may use a trained machine learning model 190 to determine the status of the chamber. The trained machine learning model 190 may use historical data to determine chamber status.

In some embodiments, the trained machine learning model 190 is stored on server machine 192 and/or server 120. Server machine 180 and/or server machine 192 may store one or more machine learning models recently trained (e.g., to perform model performance management). For example, one or more models trained within a duration of time (e.g., last 6 months) may be stored in server machine 192 and one or more final models for predicting chamber conditions may be stored on server 120 (e.g., operable with chamber recovery tool 126).

In some embodiments, the machine learning system 170 further includes server machine 172 and server machine 180. The server machine 172 and 180 may be one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components.

Server machine 172 may include a data set generator 174 that is capable of generating data sets (e.g., a set of data inputs and a set of target outputs) to train, validate, or test a machine learning model. The data set generator 174 may partition the historical data 142 into a training set (e.g., sixty percent of the historical data, or any other portion of the historical data), a validating set (e.g., twenty percent of the historical data, or some other portion of the historical data), and a testing set (e.g., twenty percent of the historical data). In some embodiments, the chamber status component 194 generates multiple sets of training data. For example, one or more sets of training data may include each of the data sets (e.g., a training set, a validation set, and a testing set).

Server machine 180 includes a training engine 182, a validation engine 184, and a testing engine 186. The training engine 182 may be capable of training a machine learning model 190 using one or more old sensor data 144 and old process result data 146 of the historical data 142 (of the data store 140). In some embodiments, the machine learning model 190 may be trained using one or more outputs of the data preparation tool 116, the classifier tool 124, the chamber recovery tool 126, and/or the data simulation tool 128. For example, the machine learning 190 may be a hybrid machine learning model using sensor data and/or mechanistic features such as a feature extraction, mechanistic modeling and/or statistical modeling (e.g., using data preparation tool 116) The training engine 182 may generate multiple trained machine learning models 190, where each trained machine learning model 190 corresponds to a distinct set of features of each training set.

The validation engine 184 may determine an accuracy of each of the trained machine learning models 190 based on a corresponding set of features of each training set. The validation engine 184 may discard trained machine learning models 190 that have an accuracy that does not meet a threshold accuracy. The testing engine 186 may determine a trained machine learning model 190 that has the highest accuracy of all of the trained machine learning models based on the testing (and, optionally, validation) sets.

In some embodiments, the training data is provided to train the machine learning model 190 such the trained machine learning model may receive a new input having new sensor data indicative of a new state of a new processing chamber. The new output may indicate whether a new substrate processed by the new processing chamber in the new state according to the first substrate processing procedure results in the new substrate having a new process result that meets the threshold condition.

The machine learning model 190 may refer to the model that is created by the training engine 182 using a training set that includes data inputs and corresponding target output (historical results of processing chamber under parameters associated with the target inputs). Patterns in the data sets can be found that map the data input to the target output (e.g. identifying connections between portions of the sensor data and resulting chamber status), and the machine learning model 190 is provided mappings that captures these patterns. The machine learning model 190 may use one or more of logistic regression, syntax analysis, decision tree, or support vector machine (SVM). The machine learning may be composed of a single level of linear of non-linear operations (e.g., SVM) and/or may be a neural network.

Chamber status component 194 may provide current data (e.g., current sensor data associated with a state of a processing chamber during a seasoning procedure) as input to trained machine learning model 190 and may run trained machine learning model 190 on the input to obtain one or more outputs including a set of values indicating a likelihood of threshold conditions being met a various points of the seasoning procedure. For example, to determine an optimal quantity of substrates to process during a seasoning procedure to prepare a chamber for production (e.g., without wasting unneeded seasoning wafers). Chamber status component 194 may be capable of identifying confidence data from the output that indicates a level of confidence that at various points of the seasoning procedure a status of the processing chambers meets threshold conditions to move to a production mode. In one non-limiting example, the level of confidence is a real number between 0 and 1 inclusive, where 0 indicates no confidence of the one or more chamber statuses and 1 represents absolute confidence in the chamber status.

For purpose of illustration, rather than limitation, aspects of the disclosure describe the training of a machine learning model and use of a trained learning model using information pertaining to historical data 142. In other implementation, a heuristic model or rule-based model is used to determine a chamber status.

In some embodiments, the functions of client devices 150, server 120, data store 140, and machine learning system 170 may be provided by a fewer number of machines than shown in FIG. 1. For example, in some embodiments server machines 172 and 180 may be integrated into a single machine, while in some other embodiments server machine 172, 180, and 192 may be integrated into a single machine. In some embodiments, the machine learning system 170 may be fully or partially provided by server 120.

In general, functions described in one embodiment as being performed by client device 150, data store 140, metrology system 110, manufacturing system 102, and machine learning system 170 can also be performed on server 120 in other embodiments, if appropriate. In addition, the functionality attributed to a particular component can be performed by different or multiple components operating together.

In embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 2A:
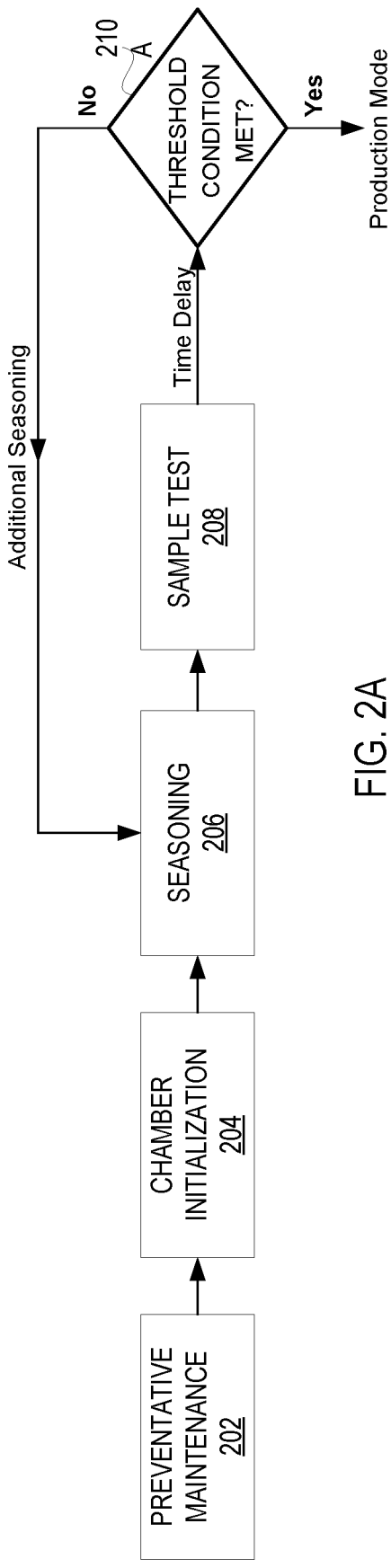
FIGS. 2A-B are block diagrams illustrating chamber recovery processes 200A-B in which implementations of the present disclosure may operate.
Figure 2B:
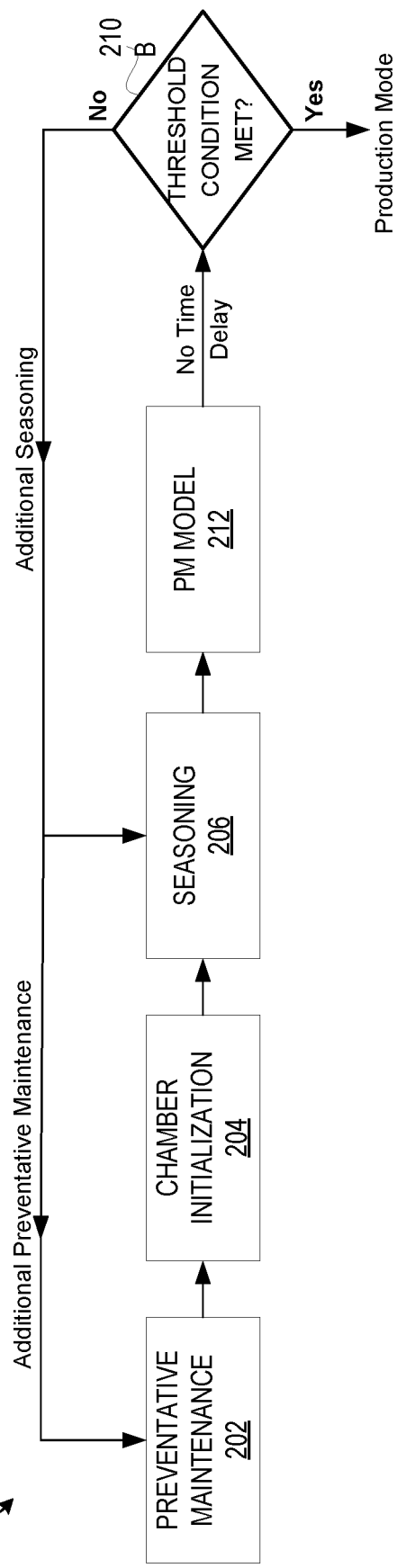

FIGS. 2A-B are block diagrams illustrating chamber recovery processes 200A-B in which implementations of the present disclosure may operate. The chamber recovery processes 200A-B may include performing preventative maintenance 202 on one or more processing tools. Preventative maintenance 202 may include any number of processes performed on one or more processing tools (e.g., processing chambers) to maintain conditions of the processing chamber over time. In some embodiments, preventative maintenance 202 may employ proactive preventative maintenance procedures with one or more of the following aims: minimize downtime of the processing equipment, keep maintenance costs lower (e.g., maintain minor repairs than prevent larger less frequent repairs), extend life of the processing equipment, improve production quality (e.g., process results of substrates), improve processing efficiency (e.g., keep tool in production mode longer and reduce down time of processing equipment), and/or preserve safety and integrity of equipment, among other things.

In some embodiments, preventative maintenance 202 includes cleaning (e.g., wet clean maintenance) one or more processing chambers (e.g., removing build-up on chamber walls resulting from processing procedures performed within the processing chamber). The preventative maintenance 202 may restore a condition of one or more processing tools into an unseasoned state (e.g., a clean chamber that is has not yet undergone a seasoning process). Replacement and/or cleaning of one or more processing tools may result in the processing tool operating in a clean (e.g., raw) state that is further refined by using the processing tool to perform substrate processing procedures. For example, a processing chamber may be returned to an unseasoned state such as a new or clean state after the preventative maintenance 202 is performed.

As shown in FIG. 2, chamber recovery process 200A-B includes chamber initialization. Chamber initialization 204 may include warming up the chamber or activating one or more systems associated with the processing chamber. For example, chamber initialization 204 may be performed to prepare a processing chamber to receive and process substrates. The chamber initialization may be associated with one or more process procedures (e.g., process procedures 106 of FIG. 1) that may include one or more process parameters (e.g., temperature, pressure, vacuum conditions, etc.).

As shown in FIG. 2, chamber recovery process 200A-B includes seasoning 206 of a processing chamber. Chamber seasoning 206 is a procedure of processing a series of substrates (e.g., blank silicon wafers) to restore a chamber condition that is suitable for production substrate process. For example, in some embodiments, after chamber seasoning, a thin layer of silicon oxide covers the chamber wall. At seasoning 206, an initial quantity of seasoning wafers (e.g., 20 or more seasoning wafers) are processed. Chamber recovery process 200A leverages a test sample 208 to determine whether chamber conditions are met to transition to a production mode, while chamber recovery process 200B uses a preventative maintenance (PM) model 212 to determine whether chamber conditions are met to transition to the production mode.

In some embodiments, as shown in FIG. 2A, after seasoning of the chamber by a first quantity of wafers is performed, a sample test a sample test 208 is performed and evaluated. A test sample may include processing a substrate by the processing chamber under post seasoning conditions of a first quantity of substrates. The sample is measured and various process result criteria is evaluated on the sample test. For example, a sample test 208 may be evaluated to determine whether the substrate includes a processing results meeting threshold criteria such as critical dimensions, process uniformity thresholds, thickness profile requirements, etc. Processing and evaluating the sample test may involve a duration of down time required to process the substrate and evaluate the processed substrate (e.g., measure process results such as thickness, and uniformity condition across a surface of the substrate).

At block 210A, chamber recovery process 200A may determine whether one or more threshold conditions of a processing chamber are met based on the sample test 208. Threshold conditions may include criteria associated with one or more process results of the sample test 208. As previously indicated, a sample test 208 may be evaluated to determine whether the substrate includes a processing result meeting threshold criteria such as critical dimensions, process uniformity thresholds, thickness profile requirements, etc. any of which may be evaluation criteria to determine whether a chamber meets the condition to transition to a production mode of operation. Processing logic may determine that a status of the chamber does not meet the threshold condition(s) and further perform additional seasoning 206 and another sample test 208 to determine whether the chamber is properly seasoned (e.g., meeting the threshold condition). The process of seasoning 206, performing a sample test 208, and evaluating whether threshold conditions of the process chamber (e.g., block 210) are met based on the previous sample test can be repeated until the chamber meets the threshold condition or until a threshold quantity of seasoning wafers or seasoning iterations have been performed. Upon determining the threshold condition is met the chamber recovery process 200A may proceed with initiating a production mode of the processing chamber.

Chamber recovery process 200B includes performing preventative maintenance (PM), chamber initialization and initial seasoning 206, as previously described. As shown in FIG. 2B chamber recovery process 200B proceeds with monitoring chamber health and evaluating a status of a processing chamber using a PM model 212. The PM model 212 may receive sensor data indicating a state of the processing chamber during seasoning 206. In some embodiments, the PM model includes one or more aspects and/or features of classifier tool 124, chamber recovery tool 126, and/or data simulation tool 128. The PM model 212 may output a notification indicating a status of the processing chamber. In some embodiments, the notification may include an indication that the chamber is recovered. For example, the PM model 212 may indicate authorization to perform a sample test 208 (e.g., to verify results of the PM model 212).

At block 210, chamber recovery process 200B receives the output from PM model 212 and determines further action to be taken responsive to the received output. In some embodiments, the notification may include an indication that the chamber is recovered. For example, the PM model 212 may indicate authorization to perform a sample test 208 (e.g., to verify results of the PM model 212). The PM model 212 may output a notification that the processing chamber is not recovered and further seasoning on the chamber is needed prior to entering the production mode. The PM model 212 may output a notification indicating the quality of the preventative maintenance does not meet a threshold condition and further preventative maintenance is needed. In some embodiments, chamber recovery process 200B may determine that conditions of the processing chamber are met and that a production mode can be initialized without the use of sample tests. In some embodiments, chamber recovery process 200B may determine that prior performed preventative maintenance is insufficient and a processing chamber may need further preventative maintenance to meet threshold condition without performing multiple seasoning 206 iterations. For example, instead of directing processing logic to seasoning 206 when threshold conditions are not met, processing logic may direct a process back to preventative maintenance 202 instead of performing seasoning (e.g., wasting seasoning wafers) that will fail to bring the chambers conditions up to meet the thresholds conditions.

In some embodiments, chamber recovery process 200B employs less time (e.g., less down time of a processing chamber) to return a chamber to a production mode. For example, chamber recovery process 200B may not require performance of a sample test (e.g., processing and evaluation of a test wafer) reach a determination that a processing chamber meets one or more threshold conditions. In another example, chamber recovery process 200B may determine that rather than performing more seasoning of a processing chamber, further preventative maintenance may be preferred in further recovering a status of a chamber to meet the one or more threshold conditions.

As will be discussed further in other embodiments, chamber recovery process 200A may be leveraged to generate training data for PM model 212. Sensor data of a processing chamber may be tracked over a seasoning process 206 and data associated with sample test 208 may be leveraged to validate output from PM model 212. For example, the PM model 212 may determine a status of a processing chamber. An evaluation of a sample test processed under the same chamber conditions can be compared against the prediction by the PM model 212 to validate and further refine the PM model 212.

Figure 3:
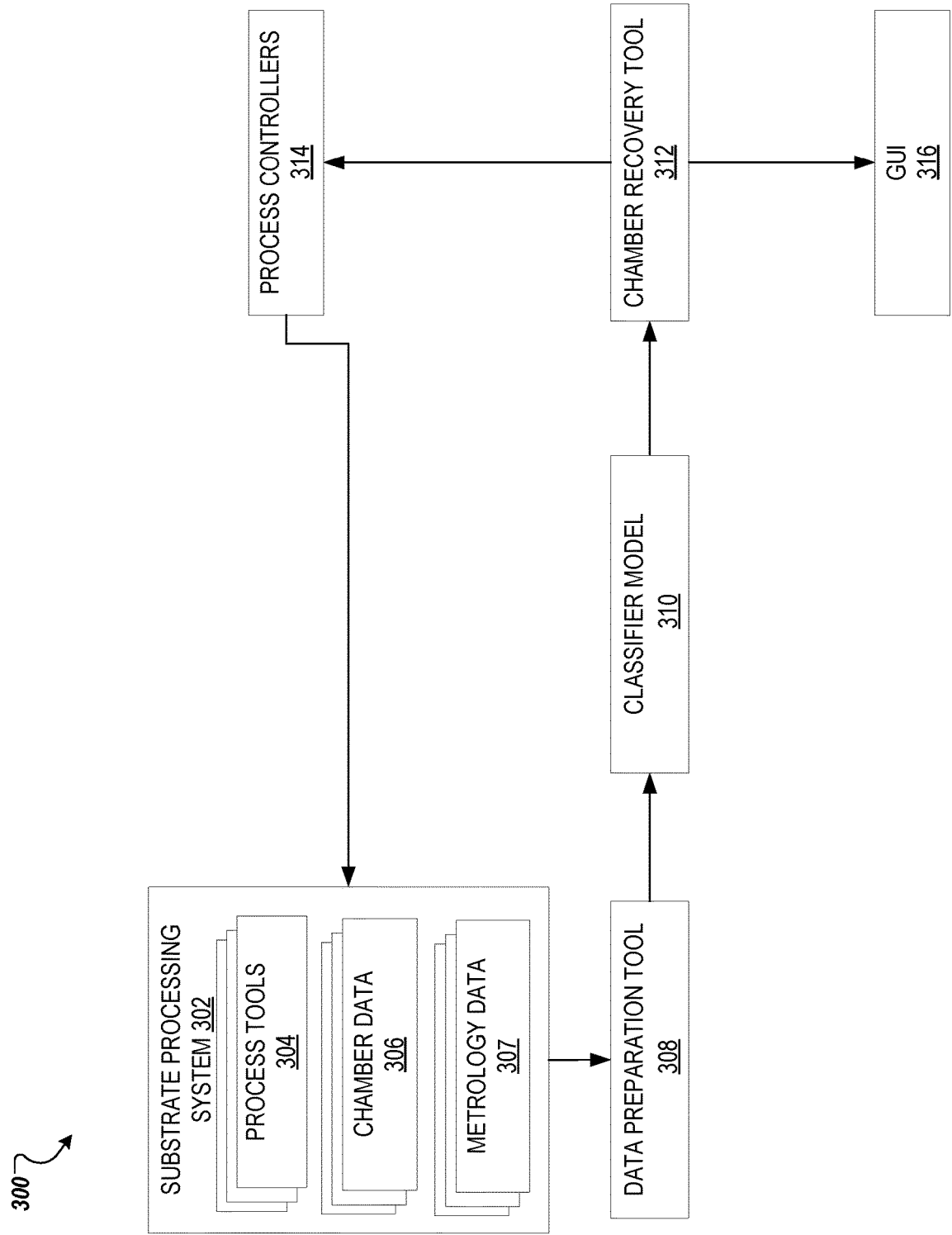
FIG. 3 is a block diagram illustrating a chamber monitoring and maintenance system 200 in which implementations of the disclosure may operate.

FIG. 3 is a block diagram illustrating a chamber monitoring and maintenance system 300 in which implementations of the disclosure may operate. The chamber monitoring and maintenance system 300 includes a substrate processing system 302 (e.g., manufacturing system 102 of FIG. 1). The substrate processing system 302 can include process tool 304 and chamber data 306 (e.g., acquired using process tools 304). The process tools 304 can include chamber sensors (e.g., to measure radio frequency (RF), temperature, gas, etc.) and additional sensors (e.g., optical emission spectroscopy (OES) sensor). The chamber data 306 can include data indicative of a state of a processing chamber. For example, process tools 304 can measure and monitor parameters such as RF, temperature, gas, spectroscopy data, etc.

In some embodiments, the chamber data 306 is processed by data preparation tool 308. The data preparation tool 308 can receive chamber data (e.g., raw sensor data) and generate synthetic data associated with various combinations, correlations, and/or artificial parameters. The data preparation tool 308 can dimensionality reduce the raw sensor data into groups or features. For example, the data preparation tool 308 may generate features that include the rate of change of a parameter value and/or a collection of parameters value. In some embodiments, data preparation tool 308 performs any of partial least squares analysis, principal component analysis, multifactor dimensionality reduction, nonlinear dimensionality reduction, and/or any combination thereof. In some embodiments, the data preparation tool 308 is designed for edge detection of the chamber data. For example, the data preparation tool 308 includes methodology that aims at identifying data points that change sharply and/or that have discontinuities. For example, the slope of one or more measured chamber parameters of a processing chamber.

In some embodiments, data preparation tool 308 performs a normalization across the various sensor data associated with various process chamber conditions. A normalization may include processing the incoming sensor data to appear similar across the various chambers and/or sensors used to acquire the data. In some embodiments, data preparation tool 308 may include aspects and/or features of data preparation tool 116 of FIG. 1.

In some embodiments, the data preparation tool 308 is used to generate input for classifier model 310. As discussed further in other embodiments, the classifier model 310 receives input data (e.g., raw sensor data, synthetic data, output of other models, etc.) to determine a status of a processing chamber (e.g., classify the chamber into one of a group of categories). In some embodiments, the classifier model receives sensor data and metrology data 307 indicative of a state of a processing chamber while processing a series of substrates (e.g., seasoning wafers). The classifier model may output a set of values indicative of a likelihood a substrate processed subsequent to an associated substrate in the series of substrates results in the substrate having a process results that meets a threshold condition (e.g., associated with a substrate processing procedure). For example, the classifier model 310 may output a series of probability values each associated with one or more substrates in the series of substrate (e.g., seasoning wafers). The probability values may indicate a likelihood the associated substrate or a substrate processed subsequent to the associated substrate when processed would result in the substrate having a process resulting meeting one or more threshold conditions associated with a substrate processing procedure (e.g., a substrate process recipe). In some embodiments, as will be discussed further in other embodiments, the classifier model 310 may incorporate a machine learning model (e.g., trained using FIG. 6 and/or implemented using FIG. 5).

As shown in FIG. 3 the chamber monitoring and maintenance system 300 may include a chamber recovery tool 312. The chamber recovery tool 312 may receive output from classifier model 310. The chamber recovery tool 312 may approximate a chamber recovery profile (e.g., chamber recovery profile of FIG. 4) by determining a series of PM indexes associated with the output of classifier model 310. In some embodiments, the series of PM indexes are based on analysis of current and previous data (e.g., historical data 142 of FIG. 1). The chamber recovery tool 312 may determine a threshold PM index that distinguishes whether a chamber condition is good enough to pass a sample test, whether more seasoning is needed, or whether further preventative maintenance is needed. The PM index results of a series of seasoning wafer during a seasoning run can be obtained which can enable in-situ chamber monitoring by the chamber monitoring and maintenance system 300.

In some embodiments, the chamber recovery tool 312 determines one or more PM indexes associated with a status of a processing chamber. The chamber recovery tool 312 may perform statistically optimized calculations to determine threshold conditions and a mapping of seasoning wafer quantities and PM indexes. Exemplary methodology for calculating the PM index may include the following:

$$\text{PM Index } n^{th} \text{ wafer} = \ln \text{CUMSUM}(Y_{est}) * \text{AVERAGE}(Y_{est})$$

where $Y_{est}$ are classifier model results associated with each seasoning wafer of a series of seasoning wafers in a seasoning run.

In some embodiments, the chamber recovery tool 312 outputs instructions to process controllers 314 to alter one or more operations associated with the substrate processing system 302. For example, the chamber recovery tool 312 may indicate conclusion of a seasoning process and process controller may alter the operating parameters of the substrate processing system to enter a production mode of operation. In another example, the chamber recovery tool 312 may indicate a processing chamber is almost recovered and further seasoning is needed to improve conditions of the processing chamber sufficient to enter a production mode of operation. In another example, the chamber recovery tool 312 may indicate to the process controllers, that the preventative maintenance quality is insufficient (e.g., fails to meet a threshold condition) and instruction the process controller 314 to carry out further preventative maintenance on the substrate processing system 302.

In some embodiments, the chamber recovery tool 312 approximates an expected chamber condition during a seasoning run. The chamber recovery tool 312 interweave probabilities received from the classifier model 310 and estimate conditions of one chamber at a given point in time. These conditions may be represented as a PM index. As will be discussed further in association with FIG. 4, these PM indexes may be defined by a logarithmic function. The chamber recovery tool 312 may determine a quantity of substrates to process in a seasoning procedure (e.g., to meet a threshold condition of the processing chamber). For example, the PM indexes can be leveraged to determine an optimal seasoning timing (e.g., optimal number of wafers to use in a seasoning process).

As shown in FIG. 3, the process controller 314 receive input from the chamber recovery tool 312 and provide instruction to the substrate processing system 302 in carrying out further operations. For example, process controllers 314 may instruct the substrate processing system 302 to proceed with further seasoning of one or more processing chambers. In another example, process controller 314 may instruct the substrate processing system to conclude with seasoning of one or more processing chambers. In another example, processing controllers 314 may instruct the substrate processing system to perform preventative maintenance on one or more processing chambers.

As shown in FIG. 3, the chamber recovery tool 312 may output instruction to be displayed on a graphical user interface (GUI). The graphical user interface may output chamber status predictions on a graphical user interface. In some embodiments, the chamber recovery tool 312 outputs indications associated with one or more operations to perform on a substrate processing system for display on the GUI 316. For example, GUI 316 may display a notification to proceed with further seasoning of one or more processing chambers. In another example, GUI 316 may display instructions to conclude with seasoning of one or more processing chambers. In another example, GUI 316 may display a notification to perform a preventative maintenance on one or more processing chambers.

Figure 4:
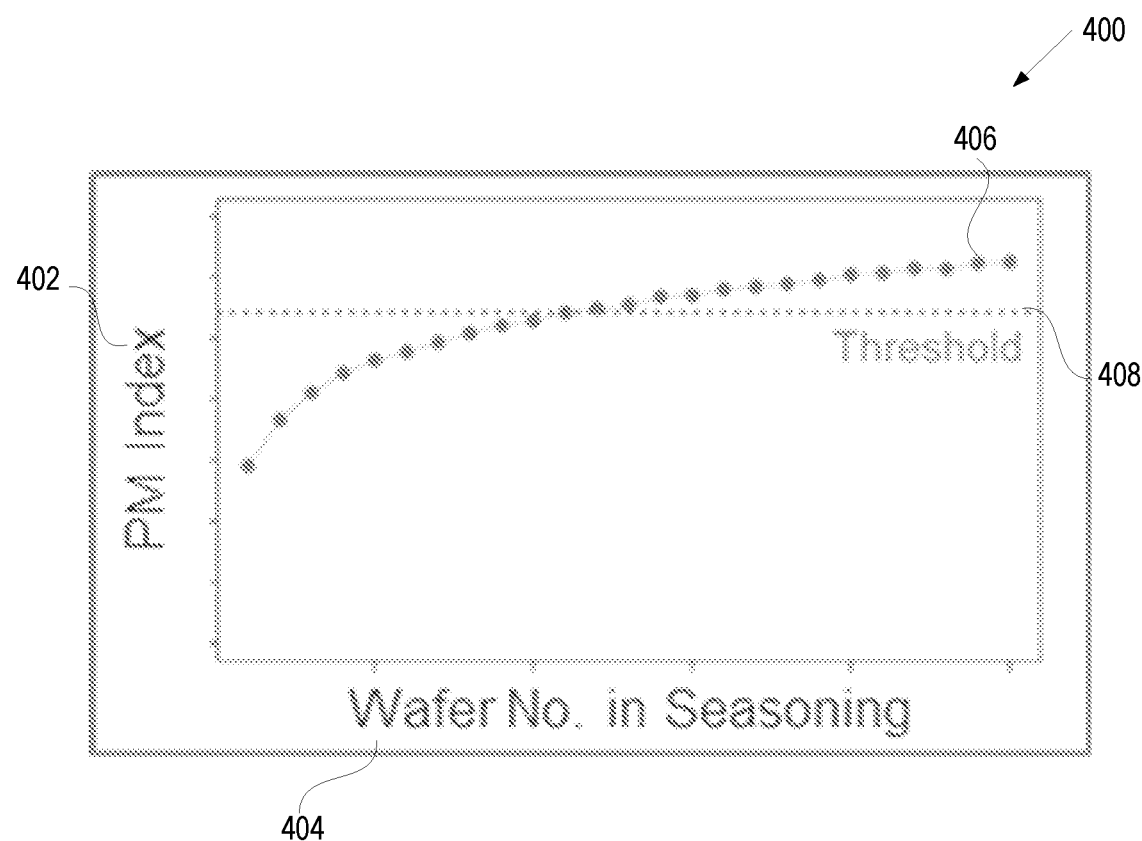
FIG. 4 depicts a graph illustrating a chamber recovery profile, in accordance with some implementations of the present disclosure.

FIG. 4 depicts a graph 400 illustrating a chamber recovery profile, in accordance with some implementations of the present disclosure. Graph 400 depicts a chamber recovery profile (e.g., generated by chamber recovery tool 312). The recovery profile may include a first data series 406 indicating PM indexes each associated with an individual seasoning wafer 404. The recovery profile may indicate a threshold 408 PM index where the conditions of the processing chamber indicate satisfaction of a chamber recovery process. For example, the intersection between the threshold 408 and the first data series 406 may indicate an optimal number of seasoning wafer to employ in a seasoning run such that a processing chamber is primed for a production mode. Specifically, that a processing chamber may process a following substrate and the substrate is likely to have a process result that meets threshold conditions of a substrate processing procedure. In some embodiments, the first data series 402 may intersect with the threshold 408 and indicate a chamber is primed for performing in a production mode. In other embodiments, the data series in other recovery profiles may not intersect the threshold and may indicate a chamber is not prepared for a production mode and may require further preventative maintenance and/or chamber seasoning.

Figure 5:
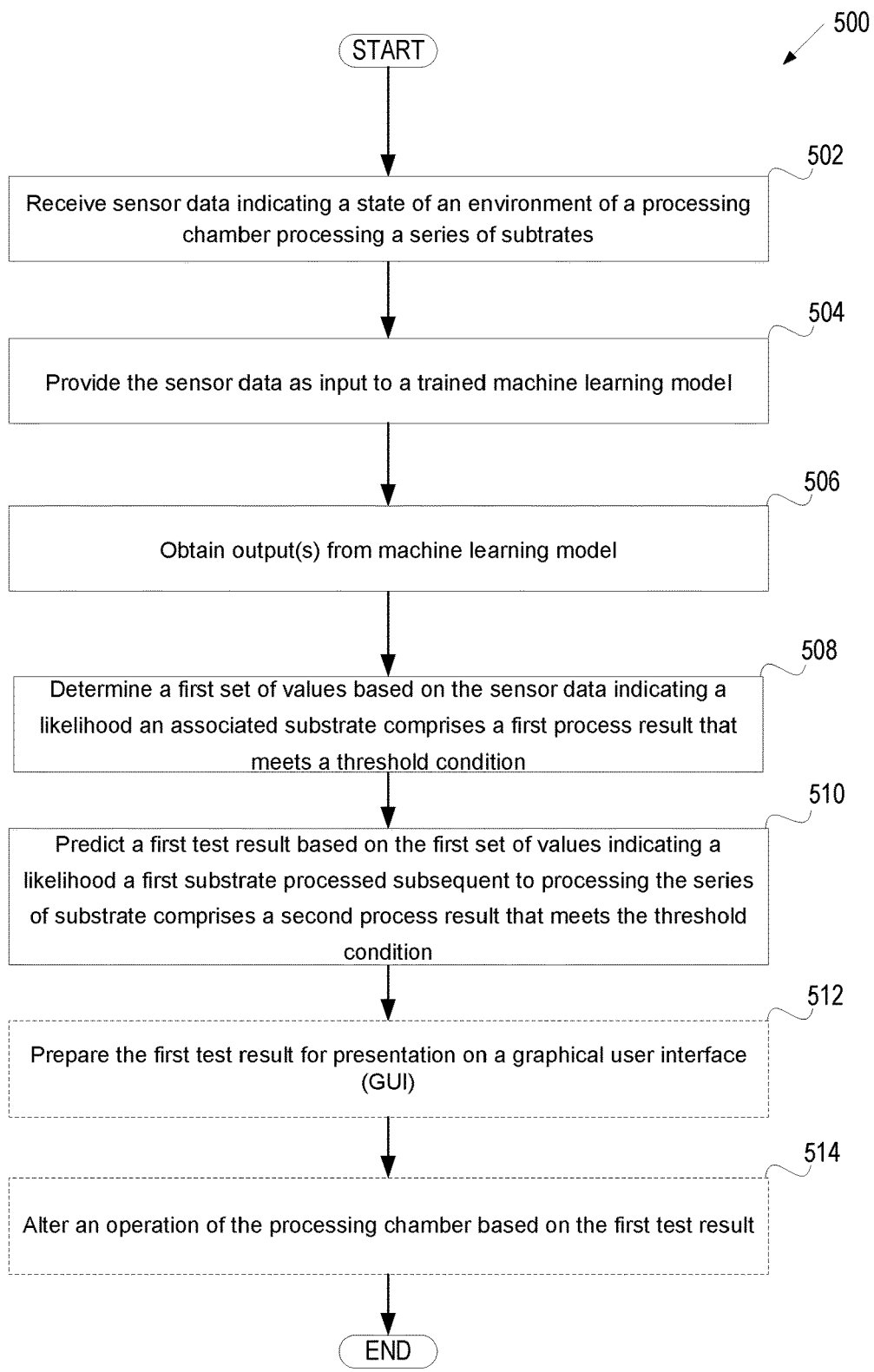
FIG. 5 depicts a flow diagram of one example method for monitoring and predicting a condition of a processing chamber, in accordance with some implementations of the present disclosure.
Figure 6:
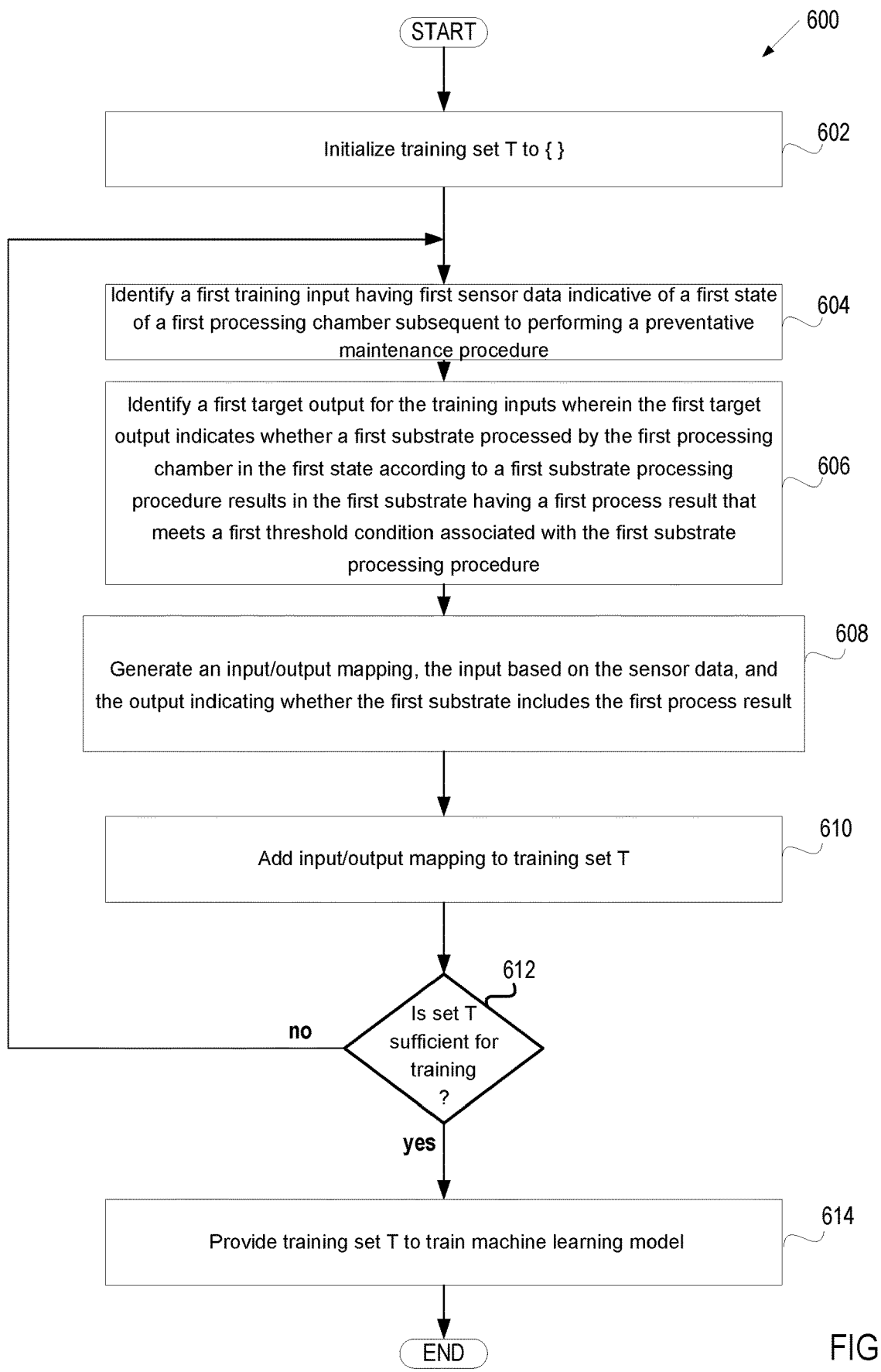
FIG. 6 is an exemplary illustration of a training phase of a machine learning system, in accordance with some implementation of the present disclosure.
Figure 7:
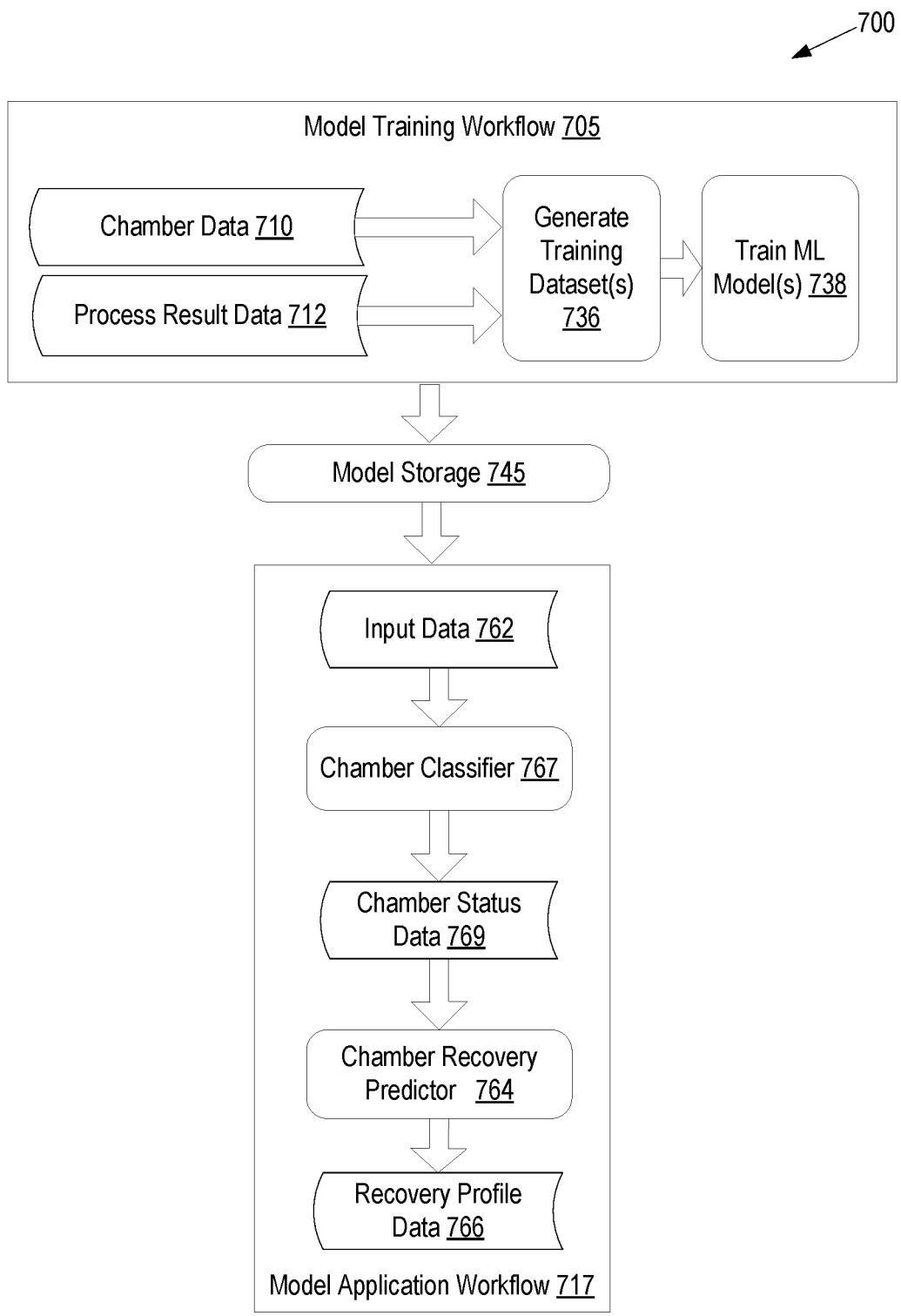
FIG. 7 illustrates a model training workflow and a model application workflow for a chamber monitoring and simulation, according to aspects of the disclosure.

FIGS. 5-7 depict flow diagrams illustrating example methods 500-700 related to training and/or using machine learning models in association with chamber data, in accordance with some implementation of the present disclosure. For simplicity of explanation, methods 500-700 are depicted and described as a series of acts. However, acts in accordance with this disclosure can occur in various orders and/or concurrently and with other acts not presented and described herein. Furthermore, not all illustrated acts may be performed to implement the methods 500-700 in accordance with the disclosed subject matter. In addition, those skilled in the art will understand and appreciate that methods 500-700 could alternatively be represented as a series of interrelated states via a state diagram or events.

FIG. 5 depicts a flow diagram of one example method 500 for monitoring and predicting a condition of a processing chamber, in accordance with some implementations of the present disclosure. Method 500 is performed by processing logic that may comprise hardware (e.g., circuitry, dedicated logic, etc.), software (such as is run on a general purpose computer system or a dedicated machine) or any combination thereof. In one implementation, the method is performed using server 120 and the trained machine learning model 190 of FIG. 1, while in some other implementations, one or more blocks of FIG. 5 may be performed by one or more other machines not depicted in the figures.

Method 500 may include receiving sensor data (e.g., associated with a processing chamber performing a seasoning procedure) and processing the sensor data using a trained machine learning model 190. The trained model may be configured to generate, based on the sensor data, one or more outputs indicating (i) a status of the processing chamber, and (ii) a level of confidence that the status accordingly represents an actual status of the processing chamber. The status of the processing chamber may indicate whether a processing chamber is recovered and ready for a production mode of operation, whether a further seasoning in needed on a processing chamber, and/or whether further preventative maintenance in needed on the processing chamber.

At block 502, sensor data indicating a state of an environment of a processing chamber is received. The state of the processing chamber is measured during a seasoning procedure (e.g., while processing a series of substrates). The sensor data may be raw data or may be processed using one or more of feature extraction, mechanistic models, and/or statistical model to prepare the sensor for input into a machine learning model. The sensor data may indicate one or more parameters (e.g., temperature, pressure, vacuum conditions, spectroscopy data, etc.) of the processing chamber.

In some embodiments, the sensor data further includes synthetic data, or data engineered from raw sensor data. For example, as described in previous embodiments, various engineering tools can perform a feature extraction and/or create artificial and/or virtual parameter combinations. A feature extractor (e.g., data preparation tool 116 of FIG. 1) can create various features by performing variable analysis such as process control analysis, univariate limit violation analysis, and/or multivariate limit violation analysis on raw sensor data. In some embodiments, the sensor data is normalized across multiple processing chamber and/or process recipes to create a comparable data set having a common basis.

At block 504, the sensor data is provided as input to the trained machine learning model, and at block 506, one or more outputs are obtained from the trained machine learning model. At block 508, a first set of values is determined based on the output(s) from the machine learning model. The first set of values indicate a likelihood an associated substrate comprises a first process results that meets a threshold condition.

In some embodiments, processing logic determines a first quantity based on the first set of values. The first value may indicate a threshold number of substrates that when processed subsequent to the preventative maintenance procedure result in the processing chamber processing a following substrate. The following substrate includes a second process result that meets a threshold condition (e.g., uniformity requirements, critical dimensions criteria, film thickness criteria, etc.) associated with a substrate processing procedure. The threshold number of substrates and the following substrate are processed according to the substrate processing procedure. The first quantity represents how many seasoning wafer are needed to recovery a state of a processing chamber to transition to a production mode of operation.

At block 510, the first set of values is used to predict a first test result. The first test result indicates a likelihood a first substrate processed subsequent to processing the series of substrates comprises a second process result that meets the threshold condition. The first test result may be predicted based on a comparison (e.g., a difference between the first quantity and the second quantity) between the first quantity and the second quantity. For example, a threshold number of substrates is compared to a current number of substrate to determine whether a sufficient quantity of seasoning wafers have been processed to recover a state of a processing chamber subsequent to performing preventative maintenance. In some embodiments, a difference between the identified quantities may be displayed on a GUI (e.g., to indicate over-seasoning or under-seasoning of one or more processing chambers).

In some embodiments, processing logic determines a recovery profile corresponding to the processing chamber. The recovery profile may include a distribution of indexes indicative of changes to the likelihood the first substrate processed subsequent to processing the series of substrate includes the second process result that meets the threshold condition. The first test result may be predicted using the recovery profile. The recovery profile may include a cumulative distribution function associated with the set of values received in the one or more output(s) of the machine learning model.

At block 512, the first test result is optionally prepared for presentation on a graphical user interface (GUI). For example, the first test result may include a notification that further seasoning is to be performed on a processing chamber, seasoning is to be terminated, and/or preventative maintenance needs to be performed on the processing chamber. At block 514, operation of the processing chamber can be altered based on the first test result. For example, processing logic may transmit instructions to one or more process controllers to alter one or more operations of a processing device (e.g., continue seasoning process, end seasoning process, begin preventative maintenance procedure, etc.)

FIG. 6 is an exemplary illustration of a training phase of a machine learning system, in accordance with some implementation of the present disclosure. Machine learning system 170 may use method 600 to at least one of train, validate, or test a machine learning model, in accordance with embodiments of the disclosure. In some embodiments, one or more operations of method 600 may be performed by data set generator 174 of server machine 172, as described with respect to FIG. 1. It may be noted that components described with respect to FIG. 1 may be used to illustrate aspects of FIG. 6.

At block 602, processing logic initializes a training set. At block 604, processing logic identifies a first data input (e.g. first training input, first validating input) that includes a first sensor (as described with respect to FIGS. 1-5). The first data input may include data indicative of a state of an environment of a processing chamber during a seasoning procedure. In some embodiments, the first data input may comprise any chamber environmental parameters (e.g., temperature, pressure, vacuum conditions, plasma conditions, spectroscopy conditions, etc.). The first target input may be identified from the old sensor data 144 of the historical data 142 (e.g., stored in the data store 140).

At block 606, processing logic identifies a first target output for one or more of the data inputs (e.g., first data input). The first target output indicates whether a first substrate processed by the first processing chamber in the first state (e.g., first data input) according to a first substrate processing procedure results in the first substrate having a first process results that meets a first threshold condition associated with the first substrate processing procedure. The first target input may be identified from the sensor data 144 of the historical data 142 (of data store 140).

At block 608, processing logic optionally generates mapping data that is indicative of an input/output mapping. The input/output mapping (or mapping data) may refer to the data input (e.g., one or more of the data inputs described herein), the target output for the data input (e.g. one or more of the data inputs described herein), the target output for the data (e.g. where the target output identifies an associated chamber status), and an association between the data input(s) and the target output.

At block 610, processing logic adds the mapping data generated at block 504 to data set T.

At block 612, processing logic branches based on whether the data set T is sufficient for at least one of training, validating, or testing machine learning model 190. If so ("yes" branch), execution proceeds to block 614, otherwise ("no" branch), execution continues back at block 604. It should be noted that in some embodiments, the sufficiency of data set T may be determined based simply on the number of input/output mappings in the data set, while in some other embodiments, the sufficiency of data set T may be determined based on one or more other criteria (e.g., a measure of diversity of the data examples, accuracy, etc.) in addition to, or instead of, the number of input/output mappings.

At block 610, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 614, machine learning model (e.g., machine learning model 190) can be at least one of trained using training engine 182 of server machine 180, validated using validating engine 184 of server machine 180, or tested using testing engine 186 of server machine 180. The trained machine learning model may be implemented by chamber status component 194 (of server machine 192) to identify chamber status of chambers (e.g., likelihood substrate processed within the chamber have process results meeting threshold conditions) based on received sensor data.

In some embodiments, a training dataset that was generated is used to train a machine learning model and/or a physical model. The model may be trained to receive as an input chamber sensor data. The model may output a status of the chamber (e.g., likelihood substrates processed within the chamber have process results meeting threshold conditions) based on received sensor data. In embodiments, the model may be agnostic to individual processing chamber, preventative maintenance performed, and/or process recipes used in the production mode. Accordingly, the model may be generated based on training data items generated based on seasoning processes run on a first processing chamber, and may then be used for a second processing chamber without performing any transfer learning to tune the model for the second processing chamber.

In one embodiment, the trained machine learning model is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, partial least square regression, percentage regression, leas absolute deviations, nonparametric regression, scenario optimization and/or distance metric learning may be performed to train the regression model. In one embodiment, the trained machine learning model, includes a support vector machine or other type of machine learning model.

In one embodiments, the trained machine learning model employs ensemble modeling. Ensemble modeling may include training multiple models (e.g., two or more related but different analytical models) and synthesizing the results of each of the model into a single score or spread (e.g., improving accuracy and reducing from any one machine learning model). For example, the trained machine learning model may include a bootstrap aggregation ("bagging") model. Bagging may include an aggregation phase and a bootstrapping phase for each individual model. Bootstrapping includes sampling or creating a dataset (e.g., using method 600), where each sample (e.g., sensor data associated with performing a seasoning procedure on a processing chamber) is selected and replaced (e.g., at random) within a broader sample set. For each, as previously indicated, multiple models may be generated based on different subsets of the broader total set of training data (e.g., historical data 142). The multiple models may output results that are synthesized (e.g., aggregated) to form an overall score (e.g., overall confidence level) associated with an identified output of the ensemble of models (e.g., a predicted chamber status). In another example, the machine learning model may include a random forest model. The machine learning model leverages multiple decision trees or types of analytical models designed to predict outputs based on different variables and rules. The random forest model may blend decisions trees that analyze different sample data, evaluate different factors, or weight common variables by different amounts. The results of the various decision trees may be converted into a synthesized result (e.g., a simple average or aggregated through further weighting) to predict a status of a chamber based on inputted sensor data.

In one embodiment, the trained machine learning model is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

The trained machine learning model may be periodically or continuously retrained to achieve continuous learning and improvement of the trained machine learning model. The model may generate an output based on an input, an action may be performed based on the output, and a result of the action may be measured. In some instances, the result of the action is measured within seconds or minutes, and in some instances, it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input (e.g., sensor data), the output of the trained machine learning model (e.g., chamber status), and the target result (e.g., target process result of a substrate) actual measured result (e.g., measured process result of a substrate) may be used to generate a new training data item. The new training data item may then be used to further train the trained machine learning model. This retraining process may be performed on-tool on the manufacturing system (e.g., processing chamber(s)) in some embodiments.

FIG. 7 illustrates a model training workflow 705 and a model application workflow 717 for chamber monitoring and simulation, according to aspects of the disclosure. In embodiments, the model training workflow 705 may be performed at a server which may or may not include a chamber classifier and/or chamber recovery predictor application, and the trained models are provided to a chamber classifier and/or chamber recovery predictor application, which may perform the model application workflow 717. The model training workflow 705 and the model application workflow 717 may be performed by processing logic executed by a processor of a computing device (e.g., server 120 of FIG. 1). One or more of these workflows 705, 717 may be implemented, for example, by one or more machine learning modules implemented processing device and/or other software and/or firmware executing on a processing device.

The model training workflow 705 is to train one or more machine learning models (e.g., deep learning models) to perform one or more determining, predicting, modifying, etc. tasks associated with a chamber classification and chamber recovery predictions (e.g., determining a process chamber is properly seasoned and ready for a production mode of operation). The model application workflow 717 is to apply the one or more trained machine learning models to perform the determining and/or tuning, etc. tasks for chamber data (e.g., raw sensor data, synthetic data, indicative of a state of a processing chamber). One or more of the machine learning models may receive process result data (e.g., chamber status and/or recovery profile).

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting In embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained machine learning models may be trained to perform are as follows:

a. Chamber classifier—As discussed previously, various input data such as sensor data, pre-processed data, synthetic data indicative of a state of a processing chamber during a seasoning process (e.g., processing a series of seasoning wafers) may be received and processed by chamber classifier. The chamber classifier may output various values corresponding to various seasoning wafer indicating a likelihood a substrate process under the corresponding chamber condition results in the substrate having a process result that meets threshold conditions associated with a substrate process (e.g., a substrate and/or manufacturing recipe).

b. Chamber recovery predictor—Chamber recovery predictor may receive data from chamber classifier and generate a chamber recovery profile associated with a recovery of a processing chamber associated with a preventative maintenance and/or a seasoning procedure. Chamber recovery predictor may determine a preventative maintenance index indicating changes in the likelihood a chamber meets conditions to move from a recovery mode of operation to a production mode of operation. For example, the chamber recovery predictor may identify when conditions of a chamber meet threshold conditions such that substrate processed under the chamber conditions results in the substrate having process results meeting threshold conditions associated with one or more process procedures. In some embodiments, the chamber recovery predictor outputs preventative maintenance index values associated with a likelihood a chamber meets threshold conditions to transition to a production mode of operation.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input may be chamber data (e.g., raw sensor chamber measuring parameters such as temperature, pressure, vacuum conditions, etc. within the chamber); the second layer may compose feature data associated with parameters associated with a substrate processing procedure or process recipe; the third layer may include historical threshold and chamber status under similar conditions. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future sensor and/or process result measurements and make predictions based on this continuous sensor information (e.g., sensor data indicating evolving conditions of a processing chamber). RNNs may be trained using a training dataset to generate a fixed number of outputs (e.g., to determine a set of substrate processing rates, determine chamber conditions, and production mode requirements and conditions thresholds). One type of RNN that may be used is a long short term memory (LSTM) neural network.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

For the model training workflow 705, a training dataset containing hundreds, thousands, tens of thousands, hundreds of thousands or more chamber data 710 (e.g., sensor data, synthetic data indicative of states of associated processing chambers) should be used to form a training dataset. In embodiments, the training dataset may also include an associated process result data 712 (e.g., measured parameters of substrate (e.g., critical dimensions, uniformity requirements, film thickness results, etc.) for forming a training dataset, where each data point may include various labels or classifications of one or more types of useful information. Each case may include, for example, data indicative of a one or more processing chamber undergoing a seasoning process and associated process results of substrates evaluated during and/or after the seasoning process. This data may be processed to generate one or multiple training datasets 736 for training of one or more machine learning models. The machine learning models may be trained, for example, to automate classifier of chambers (e.g., chamber meets conditions to operate in a production mode) and/or predict threshold quantities of substrate when a chamber meets the threshold conditions to operate in the production mode.

In one embodiment, generating one or more training datasets 736 includes performing chamber recovery process 200A by performing preventative maintenance 202 and seasoning 206 and evaluating a sample test 208 to determine whether a chamber meets a threshold condition (e.g., block 210). One or more labels may be used on various iterations of chamber recovery process 200A to identify the sample test 208 and measured chambers conditions as meeting threshold conditions to initiate a production mode, initiate further seasoning, and/or initiate further preventative maintenance corresponding to the processing chamber. The labels that are used may depend on what a particular machine learning model will be trained to do. In some embodiments, as described in other embodiments the chamber data, process results, and/or sample test results may be represented as vectors and the process rates may be represented as one or more matrices.

To effectuate training, processing logic inputs the training dataset(s) 736 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

Training may be performed by inputting one or more of the chamber data 710 and process result data 712 into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more modifications to plasma process data (e.g., modifications to one or more plasma exposure durations). Processing logic may cause a substrate to be process using the updated recipe (e.g., with the identified modifications) and receive an updated thickness profile. Processing logic may compare the updated thickness profile against a target thickness profile and determine whether a threshold criterion is met (e.g., thickness values measured across a surface of the wafer fall within a target threshold value window). Processing logic determines an error (i.e., a classification error or prediction error) based on the difference between the identified chamber status or recovery prediction and the evaluated process result (e.g., sample test result). Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

Once one or more trained machine learning models 738 are generated, they may be stored in model storage 745, and may be added to a substrate process rate determination and/or process tuning application. Substrate process rate determination and/or process tuning application may then use the one or more trained ML models 738 as well as additional processing logic to implement an automatic mode, in which user manual input of information is minimized or even eliminated in some instances.

For model application workflow 717, according to one embodiment, input data 762 may be input into process rate determiner 767, which may include a trained machine learning model. Based on the input data 762, process rate determiner 767 outputs information indicating a likelihood an associated substrate comprises a first process result that meets a threshold condition of the substrate processing procedure.

According to one embodiment, input data 762 may be input into chamber recovery predictor 764, which may include a trained machine learning model. Based on the input data 762, chamber recovery predictor 764 outputs a chamber recovery profile, a threshold quantity of seasoning wafers needed for a chamber to meet threshold condition to operate in a production operation mode, and or a first test result indicating a likelihood a first substrate processed subsequent to processing the series of substrates comprises a process result that meets the threshold condition (e.g., associated with a substrate processing recipe).

Figure 8:
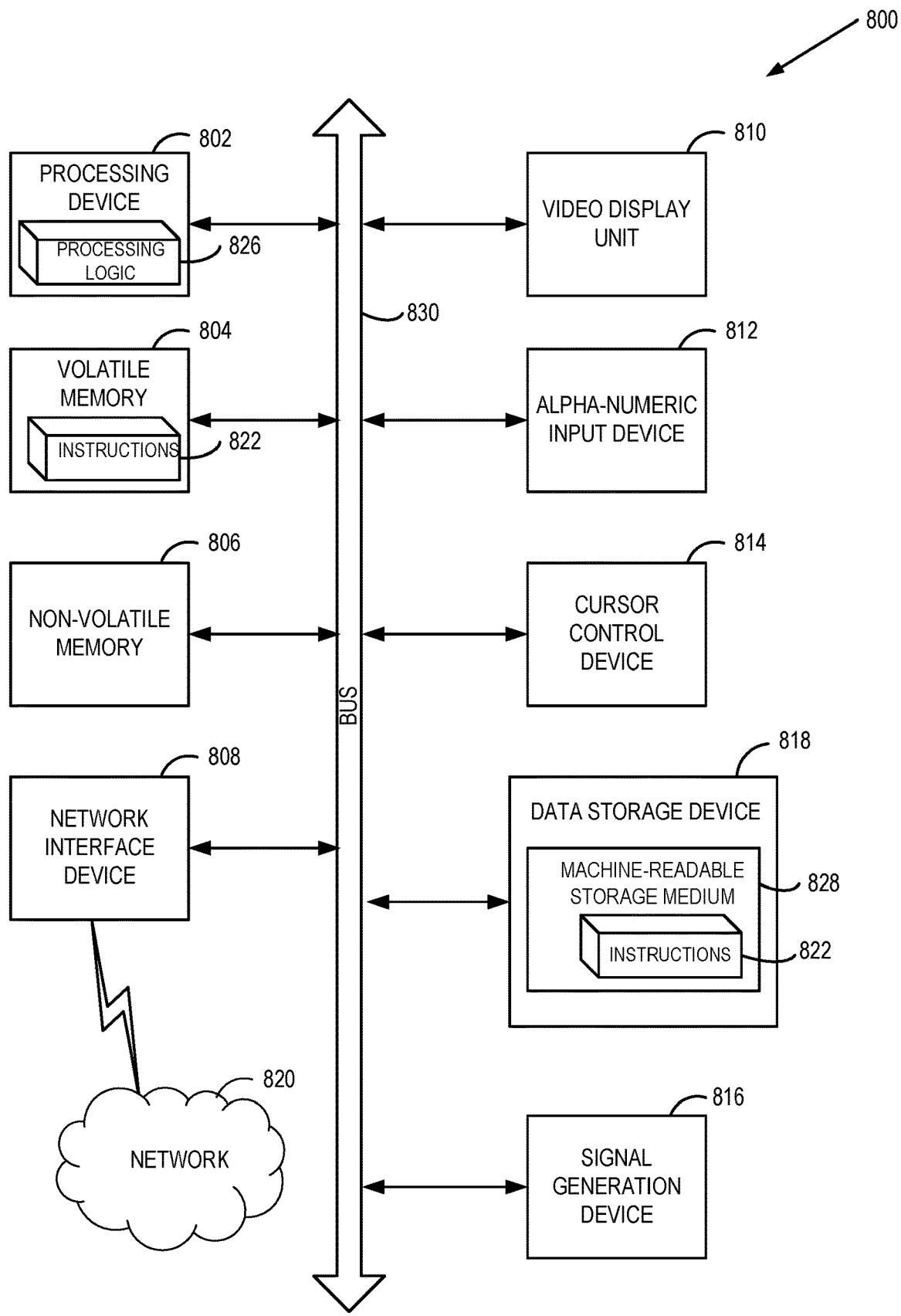
FIG. 8 depicts a block diagram of an example computing device, operating in accordance with one or more aspects of the present disclosure.

FIG. 8 depicts a block diagram of an example computing device 800, operating in accordance with one or more aspects of the present disclosure. In various illustrative examples, various components of the computing device 800 may represent various components of the client devices 150, metrology system 110, server 120, data store 140, manufacturing system 102, and machine learning system 170, illustrated in FIG. 1.

Example computing device 800 may be connected to other computer devices in a LAN, an intranet, an extranet, and/or the Internet. Computing device 800 may operate in the capacity of a server in a client-server network environment. Computing device 800 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 800 may include a processing device 802 (also referred to as a processor or CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processing device 802 represents one or more general-purpose processing devices such as a microprocessor, central processing unit, or the like. More particularly, processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 802 may be configured to execute instructions implementing methods 500, 600 illustrated in FIGS. 5-6.

Example computing device 800 may further comprise a network interface device 708, which may be communicatively coupled to a network 820. Example computing device 800 may further comprise a video display 810 (e.g., a liquid crystal display (LCD), a touch screen, or a cathode ray tube (CRT)), an alphanumeric input device 812 (e.g., a keyboard), a cursor control device 814 (e.g., a mouse), and an acoustic signal generation device 816 (e.g., a speaker).

Data storage device 818 may include a machine-readable storage medium (or, more specifically, a non-transitory machine-readable storage medium) 828 on which is stored one or more sets of executable instructions 822. In accordance with one or more aspects of the present disclosure, executable instructions 822 may comprise executable instructions associated with executing methods 500, 600 illustrated in FIGS. 5-6.

Executable instructions 822 may also reside, completely or at least partially, within main memory 804 and/or within processing device 802 during execution thereof by example computing device 800, main memory 804 and processing device 802 also constituting computer-readable storage media. Executable instructions 822 may further be transmitted or received over a network via network interface device 808.

While the computer-readable storage medium 828 is shown in FIG. 8 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method, comprising:
   receiving, by a processing device, sensor data indicating a state of an environment of one or more manufacturing equipment associated with processing a series of substrates according to a substrate processing procedure, the series of substrates processed subsequent to a preventive maintenance procedure performed on the one or more manufacturing equipment;
   determining, by the processing device, a first set of values based on the sensor data, the first set of values each associated with one of the series of substrates and indicating a likelihood an associated substrate comprises a first process result that meets a threshold condition of the substrate processing procedure;

predicting, by the processing device, a first test result based on the first set of values, the first test result indicating a likelihood a first substrate processed subsequent to processing the series of substrates comprises a second process result that meets the threshold condition; and altering one or more settings of an operation of the one or more manufacturing equipment based on the first test result, wherein the altered one or more settings control a state of the environment of the one or more manufacturing equipment to a target state.

2. The method of claim 1, further comprising:

determining a first quantity based on the first set of values, the first quantity indicating a threshold number of substrates that when processed, subsequent to the preventive maintenance procedure, results in the one or more manufacturing equipment processing a following substrate having a second process result that meets the threshold condition, wherein the threshold number of substrates and the following substrate are processed according to the substrate processing procedure.

3. The method of claim 2, wherein the series of substrates comprises a second quantity of substrates, the method further comprising:

comparing the first quantity with the second quantity, wherein the first test result is predicted based on a comparison between the first quantity and the second quantity.

4. The method of claim 3, further comprising:

determining a first difference between the first quantity and the second quantity; and preparing for presentation on a graphical user interface (GUI) a notification indicating the first difference.

5. The method of claim 1, further comprising:

determining that the one or more manufacturing equipment meets one or more conditions of a production operational mode based on the first test result.

6. The method of claim 1, further comprising determining a recovery profile corresponding to the one or more manufacturing equipment, the recovery profile comprising a distribution of indexes indicative of changes to the likelihood the first substrate processed subsequent to processing the series of substrates comprises the second process result that meets the threshold condition, wherein the first test result is predicted further using the distribution of indexes.

7. The method of claim 6, wherein the recovery profile further comprises a cumulative distribution function associated with the first set of values.

8. The method of claim 1, further comprising:

using as input the sensor data into a machine learning model; and obtaining one or more outputs of the machine learning model, the one or more outputs indicating the first set of values.

9. The method of claim 8, wherein the machine learning model comprises at least one of a bootstrap aggregation model, a random forest model, a decision tree model, or a partial least squares regression (PLS) model.

10. The method of claim 1, further comprising:

preparing the first test result for presentation on a graphical user interface (GUI).

11. A method for training a machine learning model to predict a condition of one or more manufacturing equipment, the method comprising:

generating training data for the machine learning model, wherein generating the training data comprises:

identifying a first training input having first sensor data indicative of a first state of a first manufacturing equipment subsequent to performing a preventative maintenance procedure; and identifying a first target output for the first training input, wherein the first target output indicates whether a first substrate processed by the first manufacturing equipment in the first state according to a first substrate processing procedure results in the first substrate having a first process result that meets a first threshold condition associated with the first substrate processing procedure;

providing the training data to train the machine learning model on (i) a set of training inputs comprising the first training input; and (ii) a set of target outputs comprising the first target output, wherein the trained machine learning model is to receive a new input having new sensor data indicative of a new state of a new manufacturing equipment, the new output indicating whether a new substrate processed by the new manufacturing equipment in the new state according to the first substrate processing procedure results in the new substrate having a new process result that meets the threshold condition; and responsive to determining that a retraining criterion for the trained machine learning model is satisfied, performing one or more operations to retrain the trained machine learning model based on at least the new sensor data.

12. The method of claim 11, wherein the first sensor data comprises one or more measurements acquired subsequent to the first manufacturing equipment processing a first series of substrates.

13. The method of claim 11, where the first sensor data comprises one or more measurements acquired antecedent to the first manufacturing equipment processing a first series of substrates.

14. The method of claim 11, wherein each training input in the set of training inputs is mapped to a target output in the set of target outputs.

15. A non-transitory machine-readable storage medium comprising instructions that, when executed by a processing device, cause the processing device to perform operations comprising:

receiving sensor data indicating a state of an environment of one or more manufacturing equipment associated with processing a series of substrates according to a substrate processing procedure, the series of substrates processed subsequent to a preventive maintenance procedure performed on the one or more manufacturing equipment;

determining a first set of values based on the sensor data, the first set of values each associated with one of the series of substrates and indicating a likelihood an associated substrate comprises a first process result that meets a threshold condition of the substrate processing procedure;

predicting a first test result based on the first set of values, the first test result indicating a likelihood a first substrate processed subsequent to processing the series of substrates comprises a second process result that meets the threshold condition; and altering one or more settings of an operation of the processing chamber one or more manufacturing equipment based on the first test result, wherein the altered one or more settings control a state of an environment of the one or more manufacturing equipment to a target state.

16. The non-transitory machine-readable storage medium of claim 15, the operations further comprising:

determining a first quantity based on the first set of values, the first quantity indicating a threshold number of substrates that when processed, subsequent to the preventive maintenance procedure, results in the one or more manufacturing equipment processing a following substrate having a second process result that meets the threshold condition, wherein the threshold number of substrates and the following substrate are processed according to the substrate processing procedure.

17. The non-transitory machine-readable storage medium of claim 16, wherein the series of substrates comprises a second quantity of substrates, wherein the operations further comprise:

comparing the first quantity with the second quantity, wherein the first test result is predicted based on a comparison between the first quantity and the second quantity.

18. The non-transitory machine-readable storage medium of claim 17, the operations further comprising:

determining a first difference between the first quantity and the second quantity; and preparing for presentation on a graphical user interface (GUI) a notification indicating the first difference.

19. The non-transitory machine-readable storage medium of claim 15, the operations further comprising:

determining a recovery profile corresponding to the one or more manufacturing equipment, the recovery profile comprising a distribution of indexes indicative of changes to the likelihood the first substrate processed subsequent to processing the series of substrates comprises the second process result that meets the threshold condition, wherein the first test result is predicted further using the distribution of indexes.

20. The non-transitory machine-readable storage medium of claim 15, the operations further comprising:

using as input the sensor data into a machine learning model; and obtaining one or more outputs of the machine learning model, the one or more outputs indicating the first set of values, wherein the machine learning model comprises at least one of a bootstrap aggregation model, a random forest model, a decision tree model, or a partial least squares regression (PLS) model.

* * * * *